United States Patent [19]

Takeuchi

[11] Patent Number: 4,523,312
[45] Date of Patent: Jun. 11, 1985

[54] IC TESTER

[75] Inventor: Kunio Takeuchi, Gyoda, Japan

[73] Assignee: Takeda Riken Co., Ltd., Tokyo, Japan

[21] Appl. No.: 435,742

[22] Filed: Oct. 21, 1982

[30] Foreign Application Priority Data

Oct. 29, 1981 [JP] Japan .............................. 56-173428

[51] Int. Cl.³ ...................... G01R 31/28; G06F 11/00
[52] U.S. Cl. .................................... 371/1; 324/73 R; 371/25
[58] Field of Search ................ 371/25, 1; 324/73 R, 324/73 AT, 73 PC, 57 R, 57 DE, 58 A, 58 B

[56] References Cited

U.S. PATENT DOCUMENTS

| | | | |
|---|---|---|---|
| 3,633,016 | 1/1972 | Walker et al. | 371/25 X |
| 3,657,527 | 4/1972 | Kassabgi et al. | 371/25 |
| 3,976,940 | 8/1976 | Chau et al. | 324/73 R |
| 4,055,801 | 10/1977 | Pike et al. | 324/73 R |
| 4,092,589 | 5/1978 | Chau et al. | 324/73 R |
| 4,122,995 | 10/1978 | Franke | 371/1 |
| 4,245,352 | 1/1981 | Karpowycz et al. | 324/73 R |
| 4,439,727 | 3/1984 | Boyle | 324/73 R |

Primary Examiner—Charles E. Atkinson
Attorney, Agent, or Firm—Staas & Halsey

[57] ABSTRACT

An IC tester has a plurality of drivers for delivering test pattern signals through connector lines to corresponding terminal pins of an IC being tested. Outputs supplied from the IC being tested in response to the test pattern signals are delivered back through the connector lines to comparators coupled with output terminals of the drivers, respectively, so that the outputs from the IC can be determined as to their logic levels by the comparators. A plurality of low-pass filters are connected in series between the drivers and junctions between the comparators and the connector lines. Each of the low-pass filters has a ground terminal connected to ground through a switch which is controlled to be turned off at least when an output is supplied from the IC being tested. The low-pass filter has a cutoff frequency selected so that the test pattern signals will have desired rise and fall characteristics.

18 Claims, 11 Drawing Figures

FIG. 2D OUTPUT MODE | INPUT MODE | OUTPUT MODE

IC TESTER

BACKGROUND OF THE INVENTION

The present invention relates to an IC tester for supplying a plurality of test pattern signals respectively through different drivers to corresponding terminal pins of an IC being tested and receiving response outputs from the IC to thereby test the IC.

IC testers such as disclosed in U.S. Pat. No. 4,092,589 entitled "High-speed Testing Circuit" issued May 30, 1978 generate a plurality of test pattern signals, supply them to corresponding terminal pins of an IC being tested at suitable timing, convert outputs from the IC to logic levels with a comparator, and compare converted outputs with expected values for thereby determining whether the IC being tested is acceptable or not. Proper test results cannot often be obtained when the test pattern signals are not supplied to the IC terminal pins at predetermined timing. It is therefore desirable that the test pattern signals be propagated from the signal generator to the terminal pins in equal periods of time. To this end, test pattern signal paths are tested prior to an IC test by electrically severing an IC to be tested from test pattern output terminals of the IC tester, supplying a reference timing signal to each of the test pattern signal paths, and adjust the propagation time of each test pattern signal path in order that the reference timing signals appearing at the test pattern output terminals will be in phase with each other.

In actual IC tests, the test pattern output terminals of the IC tester are connected to the corresponding terminals in an IC socket through connector lines such as a printed circuit or a coaxial cable, and the terminal pins of an IC to be tested are inserted into the IC socket. However, the grounding capacitance (stray capacitance) of each connector line and that of each IC socket terminal do not agree with each other, resulting in different propagation times required for the test pattern signals to travel from the test pattern output terminals to the IC terminal pins. Such variations in the propagation time have a larger effect as the test pattern signals approach completely rectangular waveforms with rise and fall times being zero, thus varying the relative timing at which the test pattern signals arrive at the terminal pins of the IC being tested. It would be possible to adjust the drivers for delivering the test pattern signals to round off the waveform of the test pattern signals, that is, to incline leading and trailing edges of the test pattern signals until the variations in signal arrival timing become reduced. However, adjustment of the drivers including active elements to obtain predetermined waveforms would be relatively difficult to perform, and no predetermined waveforms could stably be produced. Furthermore, such an effort would be disadvantageous in that the rise and fall times would be varied by a variation in the amplitude of the output waveforms from the drivers.

SUMMARY OF THE INVENTION

It is an object of the present invention to provide an IC tester capable of supplying test pattern signals to an IC tester being tested at proper relative timing without being influenced by the grounding capacities of connector lines and the IC socket.

Another object of the present invention is to provide an IC tester for easily generating and stably delivering test pattern signals having waveforms which are less affected by the grounding capacities of connector lines and the IC socket.

Still another object of the present invention is to provide an IC tester for supplying an IC being tested with test pattern signals having substantially constant rise and fall times regardless of variations in the amplitude of output waveforms from drivers.

A still further object of the present invention is to provide an IC tester capable of stably supplying test pattern signals at proper relative timing to an IC being tested which has input terminal pins doubling as output terminal pins, wherein the IC tester has a small capacitance as seen from the IC being tested when the IC produces outputs.

According to the present invention, a plurality of low-pass filters are respectively connected in series between outputs of drivers for delivering test pattern signals and connector lines for connecting the driver outputs to corresponding terminal pins of an IC under test. The low-pass filters have nominal impedances equal to output impedances of the drivers and characteristic impedances of the connector lines. The low-pass filters have cutoff frequencies selected so that differences between delay times required for the test pattern signals to reach the terminal pins of the IC being tested will be reduced. The low-pass filters should preferably be composed of inductive and capacitive elements. Where the terminal pins of the IC being tested serve to both supply outputs and receive inputs, comparators are connected to junctions between the driver outputs and the connector lines. The outputs from the IC being tested are supplied over the connector lines to the comparators in which the IC outputs are determined as to their logic levels. Whenever the outputs are supplied from the IC being tested, the drivers are fed with inhibit signals to have high output impedances. With the IC tester for testing an IC having terminal pins for both supplying outputs and receiving inputs, the low-pass filters are connected between the junctions between the comparators and the connectors and the outputs of the drivers, and switches are connected between ground terminals of the low-pass filters and ground, the switches being controlled to be turned off by the inhibit signals. The test pattern signals are thus supplied through the low-pass filters to the IC being tested, so that differences in relative timing between the test pattern signals are reduced. When the outputs generated from the IC being tested in response to the test pattern signals are supplied to the comparators, the filters are severed from ground to keep small the capacitance of the IC tester as seen from the IC being tested. Therefore, the outputs delivered from the IC to the comparators are not adversely affected by the filters.

The above and other objects, features and advantages of the present invention will become more apparent from the following description when taken in conjunction with the accompanying drawings in which preferred embodiments of the present invention are shown by way of illustrative example.

DETAILED DESCRIPTION OF THE PREFERRED EMBODIMENTS

Figure 1:
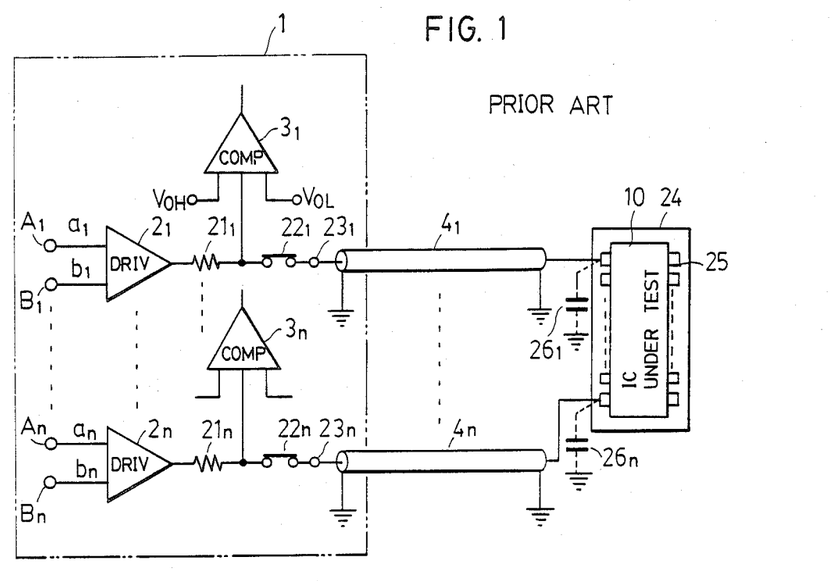
FIG. 1 is a block diagram of a portion of a conventional IC tester which is related to the present invention.

Prior to description of embodiments of the present invention, a portion of a conventional IC tester which is related to the present invention will first be described with reference to FIG. 1. Such a prior IC tester is disclosed in the foregoing U.S. patent and in the U.S. patent application Ser. No. 407,872 entitled "IC tester" filed by Shigeru Sugamori on Aug. 13, 1982.

An IC tester 1 has a signal generator (not shown) for generating a plurality of test pattern signals $a_1-a_n$ which are supplied to input terminals $A_1-A_n$ of drivers $2_1-2_n$, respectively. The drivers $2_1-2_n$ have output terminals connected respectively through output impedance elements $21_1-21_n$, which are coupled through switches $22_1-22_n$ to input and output terminals $23_1-23_n$. The output impedance elements $21_1-21_n$ and the switches $22_1-22_n$ are interconnected through junctions coupled with comparators $3_1-3_n$, respectively. The input and output terminals $23_1-23_n$ are connected respectively through connector lines $4_1-4_n$ to corresponding terminals of an IC socket 24, on which an IC 10 to be tested is mounted with its input and output terminal pins 25 inserted into the terminals of the IC socket 24. Thus, the connector lines $4_1-4_n$ are connected through the IC socket 24 respectively to the corresponding input and output terminal pins 25 of the IC 10 to be tested.

Figure 2A:
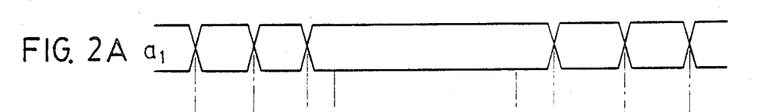
FIGS. 2A through 2D are time charts explanatory of operation of the IC tester shown in FIG. 1.
Figure 2B:
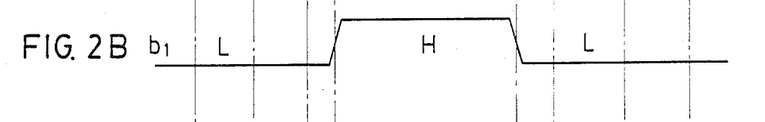
Figure 2C:
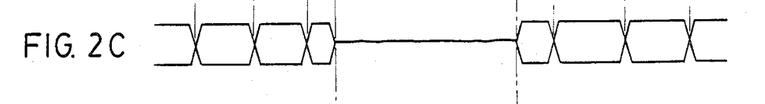
Figure 2D:
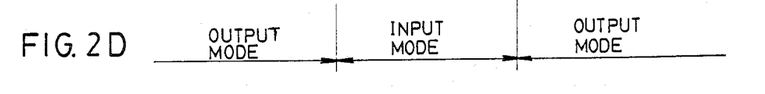

During an IC test, a test pattern signal $a_1$, for example, as shown in FIG. 2A is supplied to the driver $2_1$. At this time, a terminal $B_1$ of the driver $2_1$ is supplied with an inhibit signal $b_1$ as shown in FIG. 2B. When the inhibit signal $b_1$ is of a logic level L, the driver $2_1$ amplifies the test pattern signal $a_1$ fed through the terminal $A_1$ to a predetermined signal level, and delivers such an amplified output signal through the connector line $4_1$ to the corresponding terminal pin 25 of the IC 25. Likewise, the driver $2_i$ (i=1, 2, ..., n) and other drivers supply test pattern signals to corresponding terminal pins of the IC 10. As long as the inhibit signal $b_1$ is of a logic level L, the IC tester 1 has an output condition as shown in FIG. 2D. When the IC 10 delivers its outputs to the IC tester 1 in response to the supplied test pattern signals, the terminals $B_1-B_n$ of the drivers $2_1-2_n$ are supplied with inhibit signals $b_1-b_n$ of a high logic level as shown in FIG. 2B (only the inhibit signal $b_1$ is illustrated), whereupon the output impedances of the drivers $2_1-2_n$ become infinite. The outputs from the IC 10 are then supplied through the connector lines $4_1-4_n$ to the comparators $3_1-3_n$, respectively, in which logic levels of the outputs from the IC 10 are determined. Accordingly, the driver $2_1$ produces an output pattern as illustrated in FIG. 2C.

Figure 3A:
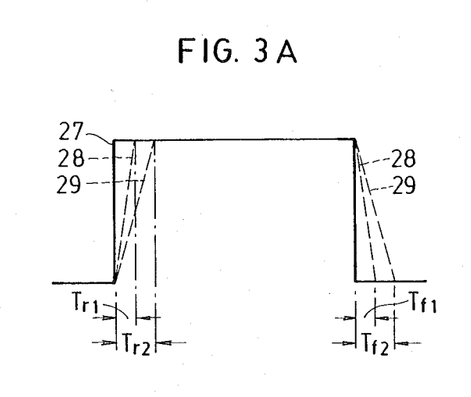
FIGS. 3A and 3B are waveform diagrams showing effects which the grounding capacitance of a connector line has on rise and fall times.
Figure 3B:
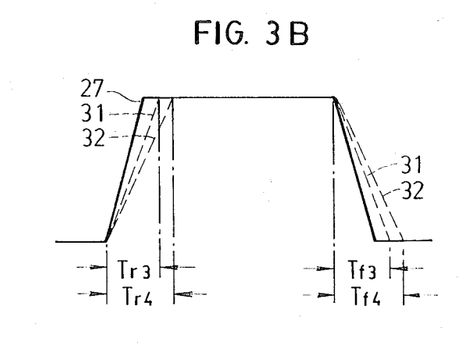
Figure 4A:
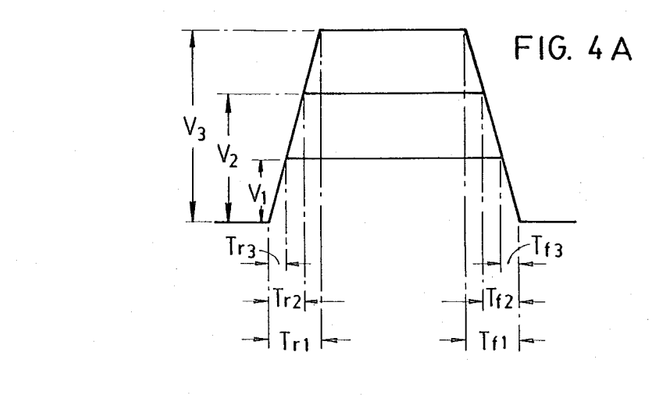
FIGS. 4A and 4B are waveform diagrams showing relationships between signal amplitudes and rise and fall times.

Prior to an IC test, the switches $22_1-22_n$ are turned off or open, and the test pattern signal paths are supplied with reference timing signals for adjusting delay times required for the reference timing signals to reach the terminals $23_1-23_n$ so that reference signal propagation times will be equalized. The test pattern signals are thus allowed to arrive at the terminals $23_1-23_n$ at predetermined relative timing. However, grounding capacitance (stray capacitance with respect to the ground) of the connector lines $4_1-4_n$, and grounding capacitance of the terminals of the socket 24 (these grounding capacitance are shown as combined capacities $26_1-26_n$ in FIG. 1) differ from each other, with the result that the test pattern signals reach the terminal pins of the IC 10 at different relative timing because of varied degrees by which the signal waveforms are rounded off. For example, as shown in FIG. 3A, even if the driver $2_i$ (i=1, 2, ..., n) produces an ideal rectangular output waveform 27 with no rise and fall times, the corresponding signal waveform reaching the terminal pin 25 of the IC 10 will become a waveform 28 having a rise time $Tr_1$ and a fall time $Tf_1$ or a waveform 29 having a rise time $Tr_2$ and a fall time $Tf_2$ due to a grounding capacitance $26_i$. The ratio of such a waveform variation, that is, $Tr_2/Tr_1$, becomes larger as the output waveform 27 from the driver approaches an ideal square waveform. When the output waveform 27 from the driver already has inclined leading and trailing edges as shown in FIG. 3B, the corresponding signal waveform arriving at the terminal pin 25 of the IC 10 will become a waveform 31 having a rise time $Tr_3$ and a fall time $Tf_3$ as shown in FIG. 3B or a waveform 32 having a rise time $Tr_4$ or a fall time $Tf_4$ with respect to the same grounding capacitance as that which causes the waveform variation as shown in FIG. 3A. Therefore, the smaller is the waveform variation due to the grouding capacitance $26_i$, the smaller the difference becomes between relative arrival times of the test pattern signals. Although it would be possible to shape such waveforms of the test pattern signals so as to be less susceptible to the grounding capacitance $26_i$ by adjusting the drivers $2_1-2_n$, such adjustments would be relatively tedious and time-consuming and the drivers thus adjusted would be unstable. As the amplitude of the output waveform from the driver $2_i$ is progressively increased as at $V_1$, $V_2$, $V_3$ as shown in FIG. 4A, the rise time and the fall time become progressively longer as at $Tr_1$, $Tr_2$, $Tr_3$ and $Tf_1$, $Tf_2$, $Tf_3$, respectively. When the rise and fall times of the output waveform 27 from the driver vary, the differences in relative timing between the test pattern signals supplied to the terminal pins of the IC being tested is also changed.

Figure 5:
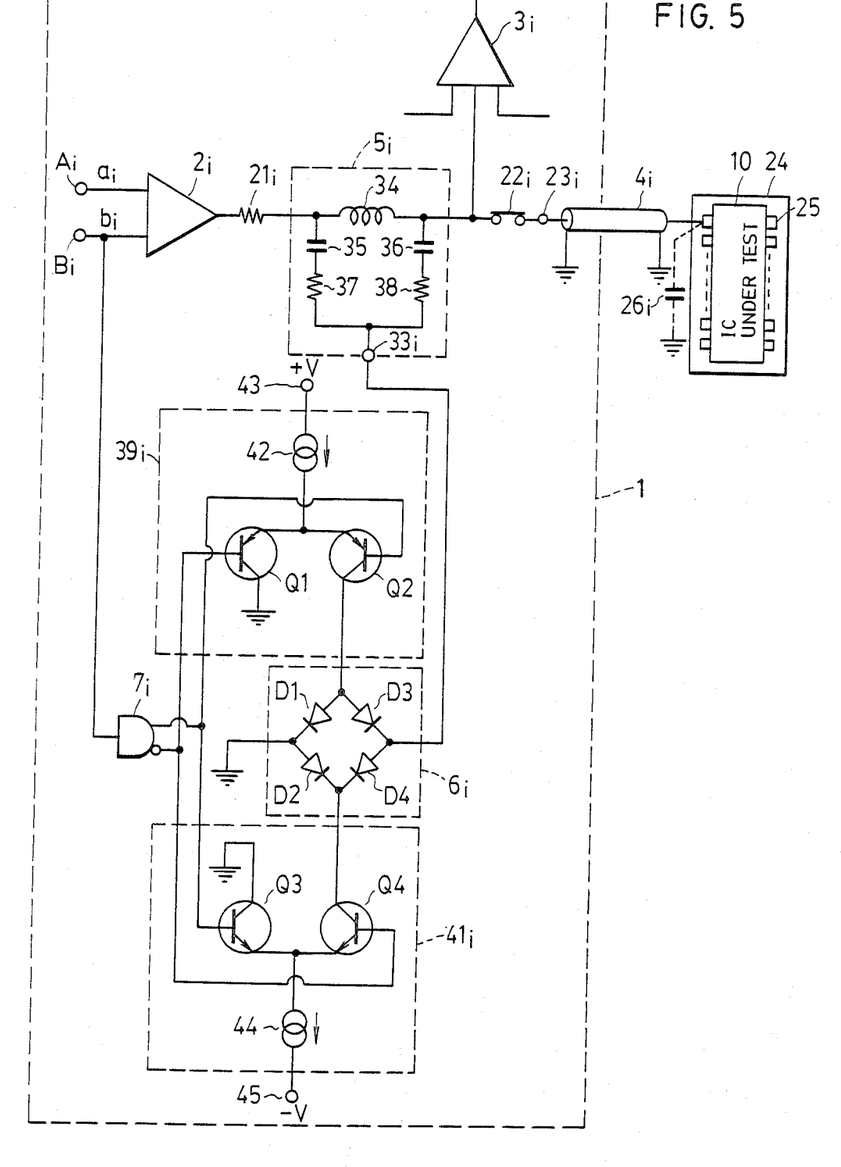
FIG. 5 is a circuit diagram of an IC tester according to an embodiment of the present invention.

FIG. 5 shows an IC tester according to the present invention. Only one of a plurality of test pattern signal paths of the IC tester 1 is shown as a representative one in FIG. 5. A low-pass filter $5_i$ is connected in series between an output impedance element $21_i$ and a junction between a comparator $3_i$ and a switch $22_i$. The low-pass filter $5_i$ has a ground terminal $33_i$ grounded through a high-speed switch $6_i$. The low-pass filter $5_i$ has an inductance element 34 connected in series to the output impedance element $21_i$, capacitors 35, 36 each having one terminal connected to respective ends of the inductance element 34 and the other terminal coupled to the ground terminal $33_i$, thus constituting a $\pi$ filter. In the illustrated embodiment, damping resistance elements 37, 38 are connected in series with the capacitors 35, 36. The high-speed switch $6_i$ comprises, for example, diodes $D_1-D_4$ connected in bridge form with the cathode of the diode $D_1$ and the anode of the diode $D_2$ being grounded and the cathode of the diode $D_3$ and the anode of the diode $D_4$ being connected to the ground terminal $33_i$.

The high-speed switch $6_i$ is turned off by the inhibit signal $b_1$ which renders the output impedance of the driver $2_i$ infinite. The driver $2_i$ has a terminal $B_i$ connected to a gate $7_i$ which produces an output to select one of current switching circuits $39_i$, $41_i$ and a reversed output to select the other current switching circuit. The current switching circuit $39_i$ is composed of a pair of PNP transistors $Q_1$, $Q_2$ having emitters connected to each other. The transistor $Q_1$ has a collector or one switching output terminal grounded, and the transistor $Q_2$ has a collector or the other switching output terminal connected to the anodes of the diodes $D_1$, $D_3$ of the switch $6_i$. The interconnected emitters of the transistors $Q_1$, $Q_2$ are connected through a constant-current path 42 to a power supply terminal 43 having a voltage $+V$. The current switching circuit $41_i$ comprises a pair of NPN transistors $Q_3$, $Q_4$ having interconnected emitters coupled through a constant-current path 44 to a power supply terminal 45 having a voltage $-V$. The transistor $Q_3$ has a collector or one switching output terminal grounded, and the transistor $Q_4$ has a collector or the other switching output terminal connected to the anodes of the diodes $D_2$, $D_4$ of the switch $6_i$. The gate $7_i$ has an output terminal connected to the bases of the transistors $Q_2$, $Q_3$, and an inverted output terminal connected to the bases of the transistors $Q_1$, $Q_4$.

The low-pass filter $5_i$ has a nominal impedance R equal to the impedance of the output impedance element $21_i$ and to the characteristic impedance of the connector line $4_i$. A cutoff frequency of the low-pass filter $5_i$ is selected to allow the test pattern signal to have a desired waveform. More specifically, the cutoff frequency of the low-pass filter $5_i$ is selected to be 0.35 times the maximum frequency of the test pattern signal waveform having desired rise and fall times. The longer the rise time of the output waveform from the filter $5_i$, the smaller the difference in relative timing between a plurality of test pattern signals as supplied to the terminal pins of the IC 10 being tested. The rise time of the output waveform from the filter $5_i$ should preferably be as long as possible or the cutoff frequency of the filter $5_i$ should preferably be as low as possible without adversely affecting the test of the IC 10. For example, where the IC to be tested is a microcomputer, each of the rise and fall times of the waveform of a test pattern signal supplied to the IC may be on the order of 3 nsec. Thus, the cutoff frequency of the filter $5_i$ should be 0.35/3 nsec. In general, the rise time of the output waveform from the driver $2_i$ is about 1 nsec. Once the cutoff frequency and the nominal impedance have been determined, constants of the components of the filter $5_i$ can readily be determined from filter design theory.

It is preferable that the switch $6_i$ be turned on and off in 1-2 nsec. Since charging and discharging currents of the capacitors 35, 36 flow in opposite directions to and from the ground terminal $33_i$ at the instant the output from the driver $2_i$ changes from a high logic level to a low logic level or vice versa, such currents need to be passed through the switch $6_i$. In the illustrated embodiment, one of the currents flows through the diode $D_3$ to the terminal $33_i$, and the other current flows from the terminal $33_i$ through the diode $D_4$.

Figure 4B:
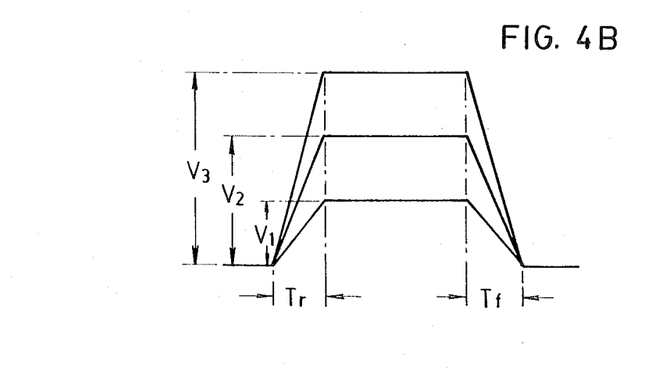

In operation, when the test pattern signal as shown in FIG. 2A is supplied to the terminal $A_i$ of the driver $2_i$ and the inhibit signal supplied to the input terminal $B_i$ is of a logic level L as shown in FIG. 2B, the driver $2_i$ is in operation, and the signal at the terminal $B_i$ causes the gate 7 to render the transistors $Q_2$, $Q_4$ conductive. The diodes $D_1$–$D_4$ are then rendered conductive to turn on the switch $6_i$. The test pattern signal supplied to the terminal $A_i$ is amplified by the driver $2_i$ to a signal level or signal power suitable for the test IC, and shaped into a waveform having sufficiently small rise and fall times. Then the test pattern signal is supplied to the low-pass filter $5_i$, in which those frequencies of the test pattern signal which are higher than the cutoff frequency of the low-pass filter $5_i$ are removed. Accordingly, the rise and fall times of the test pattern signal waveform are rendered constant as determined by the cutoff frequency of the filter $5_i$. Since the cutoff frequency of the filter $5_i$ is low enough not to adversely affect the test of the IC, the differences in relative timing between test pattern signals supplied to the terminal pins of the IC 10 are not influenced to a large extent by the grounding capacity $26_i$. A proper IC test can be conducted accordingly. The rise time Tr and the fall time Tf of the output waveform from the filter $5_i$ are determined by the cutoff frequency of the filter $5_i$, and kept constant even when the amplitude of the output waveform from the driver $2_i$ varies as at $V_1$, $V_2$, $V_3$ as shown in FIG. 4B. This is highly advantageous for testing ICs by changing the level of test pattern signals.

In the output condition of FIG. 2D in which the IC tester 1 is supplied with outputs from the IC 10 being tested, the inhibit signal fed to the terminal $B_i$ goes high in logic level as illustrated in FIG. 2B, and the output impedance of the driver $2_i$ becomes infinite. At the same time, the inhibit signal at the terminal $B_i$ causes the gate $7_i$ to render the transistors $Q_1$, $Q_3$ conductive and the transistors $Q_2$, $Q_4$ nonconductive, whereupon the diodes $D_1$–$D_4$ are rendered nonconductive to turn off the switch $6_i$. Thus, the low-pass filter $5_i$ is severed from ground. The capacity and the impedance of the driver $2_i$ as seen from the terminal $23_i$ are quite small and infinite, respectively. Therefore, the responsive output from the IC 10 being tested with respect to the test pattern signal is supplied to the comparator $3_i$ while being not affected by the presence of the filter $5_i$.

The low-pass filters $5_1$–$5_n$ may be composed of capacitive and resistive elements. Such an arrangement, however, is disadvantageous in that impedance matching cannot relatively easily be gained as the resistive element is connected in series to the output impedance element $21_i$ and the connector line $4_i$, and rise and fall characteristics are nonlinear. Therefore, the filters $5_1$–$5_n$ should preferably be of inductive and capacitive elements as shown. Since the inductive and capacitive elements tend to cause oscillation, it is preferable to insert the damping resistors 37, 38 as shown in FIG. 5 to suppress such unwanted oscillation.

Figure 6:
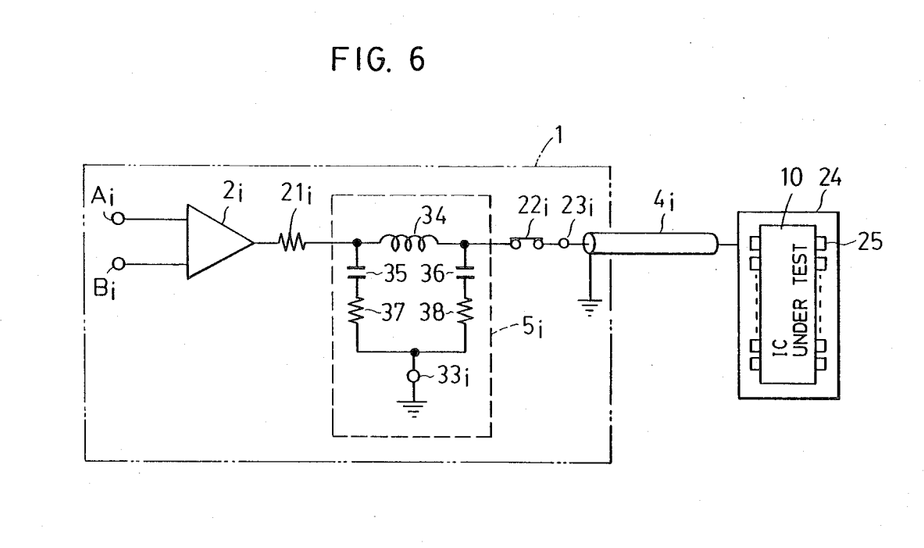
FIG. 6 is a fragmentary circuit diagram of an IC tester according to another embodiment of the present invention.

While in the above embodiment the present invention is described as being applied to an IC tester for testing an IC 10 having input and output terminal pins, the invention is equally applicable to such an IC tester for use with ICs for receiving inputs and supplying outputs through separate terminal pins. Such an alternative arrangement is shown in FIG. 6. Identical or corresponding parts in FIG. 6 are denoted by identical or corresponding reference characters shown in FIG. 5. As shown in FIG. 6, a terminal $23_i$ connected to a driver $2_i$ only supplies a test pattern signal to an IC 10 being tested, and an output from the IC 10 is not fed to the IC tester through the terminal $23_i$. Therefore, no comparator is connected to the driver $2_i$, and the switch $6_i$ as shown in FIG. 5 is dispensed with and a ground terminal $33_i$ of a filter $5_i$ is directly grounded in the arrangement of FIG. 6.

Although certain preferred embodiments have been shown and described, it should be understood that many changes and modifications may be made therein without departing from the scope of the appended claims.

What is claimed is:

1. An IC tester for testing an IC having a plurality of terminal pins by supplying a plurality of test pattern signals to the terminal pins and by receiving outputs from the IC in response to the test pattern signals, comprising:
    a plurality of drivers with output terminals for supplying the test pattern signals to respective ones of the terminal pins of the IC being tested;
    a plurality of connector lines for being respectively connected between said output terminals of said drivers and the respective terminal pins of the IC being tested for passing therethrough the test pattern signals from said drivers, said connector lines having characteristic impedances equal to the output impedances of said drivers; and
    a plurality of low-pass filters respectively connected between said output terminals of said drivers and said connector lines, said low-pass filters having nominal impedances equal to said output impedances of said drivers and cutoff frequencies selected so that differences between propagation times required for the test pattern signals to reach the terminal pins of the IC being tested are smaller than a predetermined value.

2. An IC tester according to claim 1, said terminal pins being also for receiving outputs of said IC responsive to said test pattern signals, said IC tester further including:
    means for supplying inhibit signals to said drivers when said IC provides said outputs;
    said drivers including means for being controlled by said inhibit signals to increase their output impedances when said outputs are supplied from the IC being tested;
    a plurality of comparators connected respectively to junctions between said low-pass filters and said connector lines and to respective reference voltages, for determining the logic levels of said outputs from said IC;
    said low-pass filters having ground terminals connected to ground potential;
    a plurality of switches respectively connected between said ground terminals of said low-pass filters and ground; and
    means for controlling said switches to be turned off in synchronism with said inhibit signals.

3. An IC tester according to claim 2, each said switch including;
    a pair of positive and negative power supplies having respective output terminals;
    first and second current switching circuits respectively connected to said pair of power supplies and being controllable by a control signal supplied in synchronism with said inhibit signal, each said current switching circuit having a respective terminal for outputting a respective current being switched; and
    a diode bridge having two pairs of diagonal junctions, one of said diagonal junctions of a first pair being connected to said ground terminal of the respective low-pass filter and the other of said diagonal junctions of said first pair being grounded, and one of said diagonal junctions of the second pair of said diagonal junctions being connected through said terminal of said first current switching circuit to said positive power supply, and the other of said diagonal junctions of the second pair of said diagonal junctions being connected through said terminal of said second current switching circuit to said negative power supply.

4. An IC tester according to claim 3, each of said low-pass filters being composed of inductive and capacitive elements.

5. An IC tester according to claim 4, wherein each of said low-pass filters includes damping resistors connected in series to said capacitive elements.

6. An IC tester according to claim 1, each of said low-pass filters being composed of inductive and capacitive elements.

7. An IC tester according to claim 2, each of said low-pass filters being composed of inductive and capacitive elements.

8. The tester of claim 1, said low-pass filters being selected to have a cut-off frequency that is 0.35 times the maximum frequency of the test pattern signals.

9. The tester of claim 2, said low-pass filters being selected to have a cut-off frequency that is 0.35 times the maximum frequency of the test pattern signals.

10. The tester of claim 3, said low-pass filters being selected to have a cut-off frequency that is 0.35 times the maximum frequency of the test pattern signals.

11. A tester for testing an integrated circuit having a plurality of terminals for inputting test pattern signals and outputting respective response signals, comprising
    a plurality of drivers for supplying the test pattern signals at respective output terminals,
    a respective plurality of connector lines connected at one end to respective ones of said terminals of the IC, for inputting said test pattern signals,
    a respective plurality of low-pass filters connected between said output terminals of said drivers and the other end of said connector lines,
    wherein the cut-off frequencies of said low-pass filters are determined so that variations in the propagation times of said test pattern signals as provided to the integrated circuit for said testing, due to stray capacitance, are reduced below a predetermined value.

12. The tester of claim 11, wherein the rise and fall times of the test pattern signals as provided to said integrated circuit for said testing are independent of their amplitude.

13. The tester of claim 11 or 12, wherein said integrated circuit to be tested outputs response signals responsive to said test pattern signals on the same terminals to which said test pattern signals are provided, said tester comprising
    means for increasing the output impedance of said drivers when said response signals are output from the respective integrated circuit being tested.

14. The tester of claim 13, comprising
    each said low pass filter having a connection to ground for enabling its operation,
    a respective switch connected between each said low-pass filter and said connection to ground, and
    means for closing each of said switches when said test pattern signals are provided for said testing and for opening said switches when said response signals are output from the respective integrated circuit.

15. The tester of claim 11 or 12, said connector lines having characteristic impedances equal to the output impedances of said drivers during said supplying of test pattern signals.

16. The tester of claim 15, wherein said integrated circuit to be tested outputs said response signals responsive to said test pattern signals on the same terminals to which said test pattern signals are provided, comprising means for increasing the output impedances of said drivers when said response signals are output from the respective integrated circuit being tested.

17. The tester of claim 16, each said low-pass filter having a cut-off frequency that is 0.35 times the maximum frequency of the test pattern signals.

18. The tester of claim 13, comprising means for increasing the output impedances of each said low pass filter when said response signals are output from said terminals of the integrated circuit.

* * * * *

UNITED STATES PATENT AND TRADEMARK OFFICE
CERTIFICATE OF CORRECTION

PATENT NO. : 4,523,312
DATED : June 11, 1985
INVENTOR(S) : KUNIO TAKEUCHI

It is certified that error appears in the above-identified patent and that said Letters Patent is hereby corrected as shown below:

Column 1, line 27, "adjust" should be --adjusting--.

Column 7, line 20, delete "the" (second occurrence).

Signed and Sealed this

Fifteenth Day of October 1985

[SEAL]

Attest:

DONALD J. QUIGG

Attesting Officer

Commissioner of Patents and
Trademarks—Designate